(12) United States Patent
Choi et al.

(10) Patent No.: US 7,553,720 B2
(45) Date of Patent: Jun. 30, 2009

(54) NON-VOLATILE MEMORY DEVICE AND FABRICATION METHOD THEREOF

(75) Inventors: Byoung Deog Choi, Gyeonggi-do (KR); Ki Yong Lee, Yongin-si (KR); Ho Kyoon Chung, Yongin-si (KR); Jun Sin Yi, Seoul-si (KR); Sung Wook Jung, Suwon-si (KR); Hyun Min Kim, Gwangju-si (KR); Jun Sik Kim, Seoul (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 11/604,222

(22) Filed: Nov. 27, 2006

(65) Prior Publication Data

US 2007/0122978 A1    May 31, 2007

(30) Foreign Application Priority Data

Nov. 28, 2005  (KR) ............... 10-2005-0114422

(51) Int. Cl.
*H01L 21/8238* (2006.01)
*H01L 21/336* (2006.01)
(52) U.S. Cl. ............. 438/201; 438/263; 438/264; 438/257; 438/301; 438/778; 257/E21.18; 257/E21.21; 257/E21.423

(58) Field of Classification Search ........... 257/E21.18, 257/E21.21, E21.423
See application file for complete search history.

(56) References Cited

U.S. PATENT DOCUMENTS

| 6,365,320 | B1* | 4/2002 | Foote et al. ............... 430/270.1 |
| 7,119,865 | B2* | 10/2006 | Yang et al. ................ 349/114 |
| 2001/0004537 | A1* | 6/2001 | Lee ............................ 438/163 |
| 2002/0163032 | A1* | 11/2002 | Lin et al. .................... 257/315 |
| 2004/0053468 | A1* | 3/2004 | Dong et al. ................ 438/261 |
| 2005/0037550 | A1* | 2/2005 | Kang et al. ................ 438/166 |
| 2007/0029625 | A1* | 2/2007 | Lue et al. .................... 257/411 |

FOREIGN PATENT DOCUMENTS

KR    2001-0092958    10/2001

* cited by examiner

*Primary Examiner*—Walter L Lindsay, Jr.
*Assistant Examiner*—Mohsen Ahmadi
(74) *Attorney, Agent, or Firm*—Lee & Morse, P.C.

(57) ABSTRACT

A non-volatile memory device includes a buffer oxide film on a substrate; a polysilicon layer on the buffer oxide film; a silicon oxy-nitride (SiON) layer on the polysilicon layer, a first insulator layer on the SiON layer, a nitride film on the first insulator, a second insulator layer on the nitride film, an electrode on the second insulator, and a source/drain in the polysilicon layer.

10 Claims, 4 Drawing Sheets

NON-VOLATILE MEMORY DEVICE AND FABRICATION METHOD THEREOF

BACKGROUND OF THE INVENTION

1. Field of the Invention

The present invention relates to a non-volatile memory device and a fabrication method. More specifically, the present invention relates to a non-volatile memory device formed on a glass substrate, and a method for fabricating a non-volatile memory device.

2. Description of the Related Art

Generally, a non-volatile memory device may be classified into a floating-gate memory device and a charge-trapping memory device. The floating-gate memory device is a device for maintaining a memory by using a potential well. The charge-trapping memory device is a device for maintaining a memory by trapping charges in a trap region inside a nitride film or a trap region present in an interface between a nitride film and an insulator.

A representative form of the charge-trapping memory device is a Silicon-Oxide-Nitride-Oxide-Silicon (SONOS) configuration. Typically, the SONOS configuration may include a sequential stack of a semiconductor substrate, an ONO configuration, and a gate electrode. The ONO configuration may include a sequential stack of a tunneling oxide film, a nitride film and a blocking oxide film. The tunneling oxide film may tunnel electrons into a trap region inside the nitride film or a trap region of an interface of the nitride film. The blocking oxide film may block charges from moving between the nitride film and the gate electrode. The trap region may store charges. Source/drain regions may be provided in the semiconductor substrate on either side of this stack.

Recently, creation of a non-volatile memory device on a glass substrate has been investigated. Such a configuration may include a sequential stack of the glass substrate, the ONO configuration, and the gate electrode. The glass substrate may include a protective layer, e.g., a buffer oxide film, thereon to protect the glass substrate. A polysilicon layer may be provided on the protective layer. Source/drain regions may be provided in the polysilicon layer on either side of this stack.

Creation of the polysilicon layer may include crystallizing an amorphous polysilicon layer, e.g., by irradiating the amorphous polysilicon layer with a laser. Thus, surfaces of the polysilicon layers may be rough and non-uniform, which may result in a large leakage current being generated. In other words, a leakage current may be significantly increased due to the non-uniformity and roughness of the surfaces of the polysilicon layer. Therefore, such a non-volatile memory may function abnormally during programming/erasing operations.

SUMMARY OF THE INVENTION

The present invention is therefore directed to a non-volatile memory device and fabrication method therefore, which substantially overcome one or more of the problems due to the limitations and disadvantages of the related art.

It is therefore a feature of an embodiment of the present invention to provide a non-volatile memory device on a glass substrate, the non-volatile memory device capable of reducing an excessive leakage current due to a rough upper surface of a polysilicon layer serving as a base for an ONO stack, and a fabrication method thereof.

It is therefore a feature of an embodiment of the present invention to provide a non-volatile memory device in which characteristics of a rough upper surface of a polysilicon layer may be moderated by a SiON layer which may be formed by, e.g., using a nitrous oxide ($N_2O$) plasma, between the polysilicon layer and the ONO stack, and a fabrication method thereof.

At least one of the above and other features and advantages of the present invention may be realized by providing a non-volatile memory device including a buffer oxide film on a substrate, a polysilicon layer on the buffer oxide film, a silicon oxy-nitride (SiON) layer on the polysilicon layer, a first insulator on the SiON layer, a nitride film on the first insulator, a second insulator on the nitride film, an electrode on the second insulator, and a source/drain in the polysilicon layer.

The SiON layer and the first insulator may be formed in a same insulating material having varying degrees of nitrogen content. The SiON layer may be approximately 10 to 25 Å thick, e.g., approximately 20 Å thick.

The first insulator may be approximately 20 to 40 Å thick, e.g., approximately 30 Å thick. The first insulator may be silicon dioxide ($SiO_2$).

The nitride film may be approximately 50 to 100 Å thick, e.g., approximately 80 Å thick. The second insulator may be approximately 100 to 200 Å thick, e.g., approximately 150 Å thick.

At least one of the above and other features and advantages of the present invention may be realized by providing a method for fabricating a non-volatile memory device, the method including forming a buffer oxide film on a substrate, forming a polysilicon layer on the buffer oxide film, forming a silicon oxy-nitride (SiON) layer on the polysilicon layer, forming a first insulator on the SiON layer, forming a nitride film on the first insulator, forming a second insulator on the nitride film, forming an electrode on the second insulator, and forming a source/drain by injecting impurity ions into an exposed region of the polysilicon layer.

Forming the polysilicon layer may include irradiating an amorphous silicon layer deposited on the buffer oxide film with a laser beam. Forming the SiON layer and the first insulator may include using a nitrous oxide plasma. Forming the SiON layer and the first insulator may include, after a predetermined amount of time, reducing a concentration of nitrogen in the plasma. The predetermined amount of time may be determined in accordance with a desired thickness of the SiON layer. Forming the SiON layer and the first insulator may include depositing an insulating material.

The SiON layer may be formed with a thickness of approximately 10 to 25 Å. The first insulator may be formed with a thickness of approximately 20 to 40 Å. The first insulator may be formed of silicon oxide ($siO_2$).

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
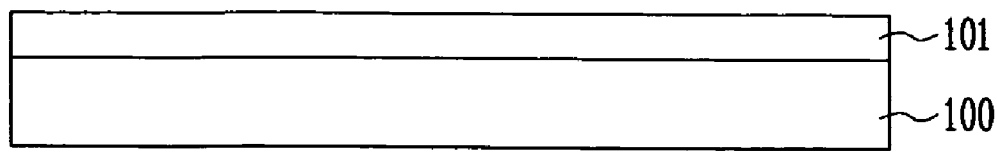
FIGS. 1A to FIG. 1H illustrate cross-sectional views of stages in a method for fabricating a non-volatile memory device according to an exemplary embodiment of the present invention.

Korean Patent Application No. 10-2005-0114422, filed on Nov. 28, 2005, in the Korean Intellectual Property Office, and entitled, "Non-Volatile Memory Device and Fabrication Method Thereof," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. When one element is connected to another element, one element may be not only directly connected to another element but also indirectly connected to another element via another element.

Further, irrelevant elements are omitted for clarity. Also, like reference numerals refer to like elements throughout.

Figure 1B:
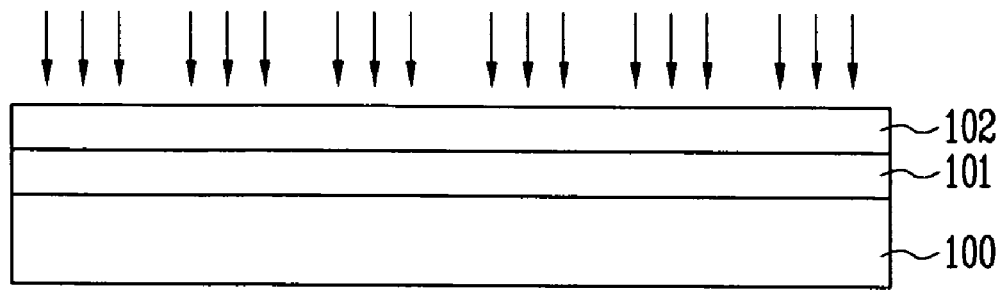
Figure 1C:
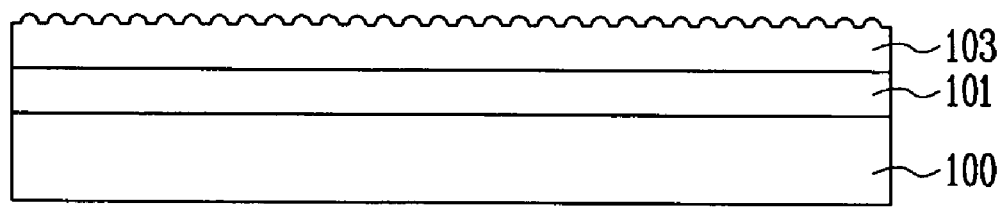
Figure 1D:
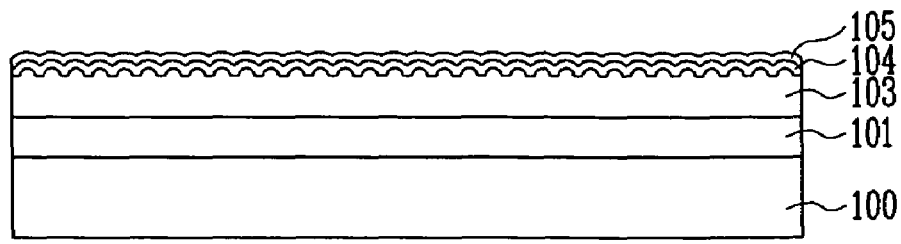
Figure 1E:
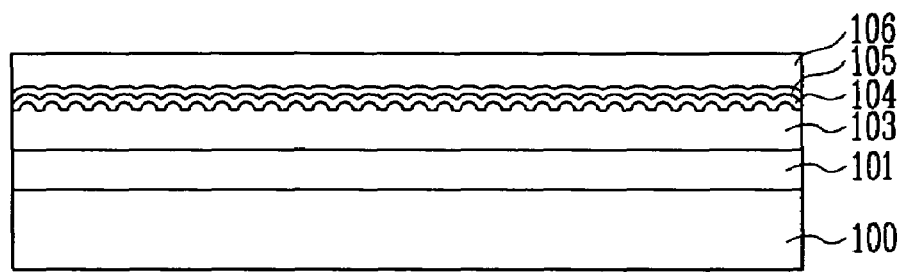
Figure 1F:
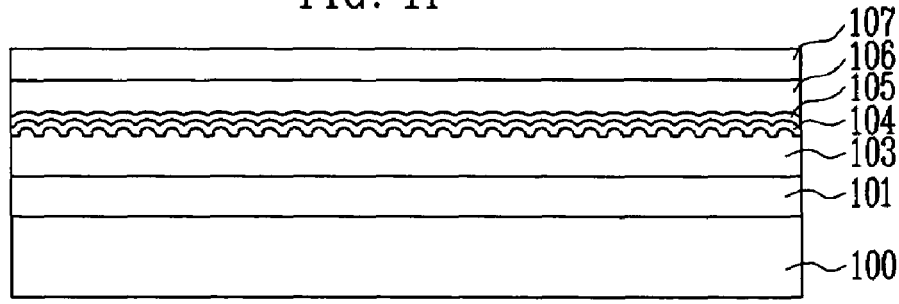
Figure 1G:
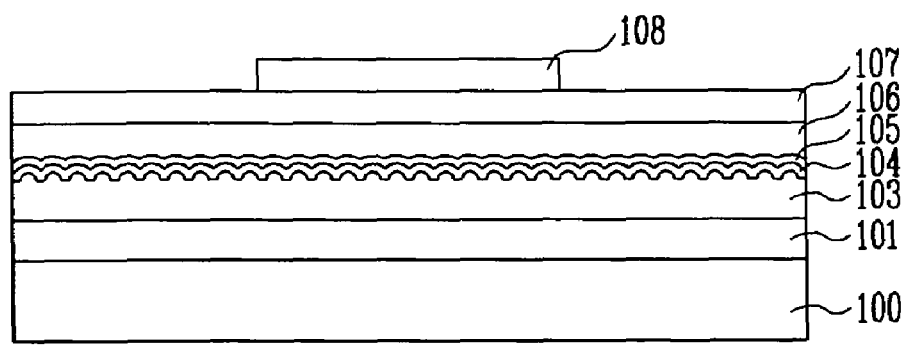
Figure 1H:
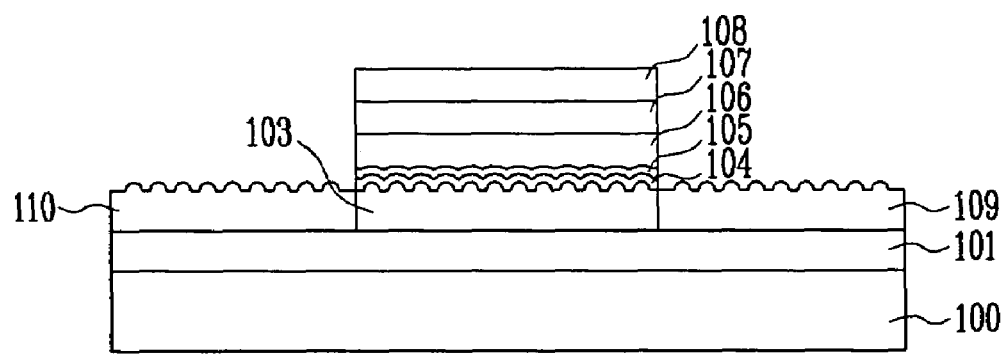

Before describing a method used to form a non-volatile memory in accordance with an exemplary embodiment of the present invention, a description of the non-volatile memory itself will be provided, as illustrated in FIG. 1H, which is a cross-sectional view thereof. As can be seen therein, the non-volatile memory may include a glass substrate 100, a buffer oxide film 101, a polysilicon layer 103, a SiON layer 104, a first insulator 105, a nitride film 106, a second insulator 107, an electrode 108, a source 109 and a drain 110. The first insulator 105 may serve as a tunneling oxide film, the nitride film 106 may serve as a trapping film, and the second insulator 107 may serve as a blocking oxide film.

Such a non-volatile memory of an exemplary embodiment of the present invention may reduce or eliminate surface roughness in the layer serving as the base for an ONO stack formed on a glass substrate. Thus, the non-volatile memory may reduce or eliminate a leakage current presently generated in such memories formed on a glass substrate, allowing the memory to function properly.

FIGS. 1A to FIG. 1H a cross-sectional views of stages in a method for fabricating a non-volatile memory device according to an exemplary embodiment of the present invention.

First, as illustrated in FIG. 1A, the buffer oxide film 101 may be deposited on the glass substrate 100, e.g., using a chemical vapor deposition (CVD) process. The buffer oxide film 101 may be formed thickly enough to block impurities between the glass substrate and a non-volatile memory device to be formed later. The buffer oxide film 101 may have a thickness of approximately 3,000 Å.

Subsequently, as illustrated in FIG.1B, an amorphous silicon layer 102 may be deposited on the buffer oxide film 101, e.g., using a CVD process. The amorphous silicon layer 102 may have a thickness of approximately 500~600 Å. The amorphous silicon layer 102 may be irradiated with a laser beam, as shown in FIG. 1B.

A predetermined thickness of the amorphous silicon layer 102 may be changed into the polysilicon layer 103 as a result of the irradiation, as shown in FIG. 1C. For convenience, this will be illustrated using only the polysilicon layer 103. However, it will be understood that part of the thickness of the amorphous silicon layer may remain, i.e., both amorphous silicon layer and polysilicon may be present in layer 103. Due to the processing of the amorphous silicon layer 102, an upper surface of the polysilicon layer 103 formed through irradiation may not be uniform, i.e., may be rough.

Next, the silicon oxy-nitride (SiON) layer 104 and the first insulator 105 may be sequentially formed on the polysilicon layer 103, as shown in FIG. 1D. The first insulator 105 may be, e.g., silicon dioxide ($SiO_2$).

The SiON layer 104 and the first insulator 105 may be formed in an inductively coupled plasma CVD apparatus using, e.g., a nitrous oxide ($N_2O$) plasma. The operation may be performed at a low temperature, e.g., about 500° C. or less. The SiON layer 104 may be thinner than the first insulator 105. The resultant SiON layer 104 may have a thickness of approximately 10 to 25 Å, e.g., approximately 20 Å. The first insulator 105 may have a thickness of approximately 20 to 40 Å, e.g., approximately 30 Å.

The SiON layer 104 and the first insulator 105 may be sequentially formed using the same apparatus, and a concentration of nitrogen included in the insulation layer formed on the polysilicon may be reduced during processing. Thus, the concentration of nitrogen may decrease from a surface of the polysilicon layer 103 to the upper surface of the first insulator 105 by varying a concentration of nitrogen in the $N_2O$ plasma while carrying out the oxidation process. In particular, the nitrogen $N_2O$ plasma may be reduced to zero at some point in the process, in accordance with a desired thickness of the SiON layer 104. In other words, the SiON layer 104 formed on the surface of the polysilicon layer 103 may include a high concentration of nitrogen, while the first insulator 105 formed on the SiON layer 104 may have little or no nitrogen.

A concentration of nitrogen may be increased in the surface of the polysilicon layer 103, forming $Si_3N_4$ at the surface of the polysilicon layer 103 at a very rapid rate in the early stage of the oxidation process using the $N_2O$ plasma. After the predetermined time, the concentration of nitrogen in the plasma may be reduced, e.g., by substituting oxygen for the nitrogen, while the insulation layer 105 grows.

Accordingly, the insulation layer may be classified into the SiON layer 104 and the first insulator 105, based on the nitrogen concentration. For example, when an insulation layer is deposited in accordance with the above process to a thickness of 80 Å, the insulation layer thinner than 40 Å may become the SiON layer 104, while the insulation layer thicker than 40 Å may become the first insulator 105, i.e., the $SiO_2$ layer, since the concentration of nitrogen may be nearly zero at a thickness of 40 Å or more from the surface of the polysilicon. While it may be most efficient to form the SiON layer 104 and the first insulator 105 in the same apparatus and from the same insulation material, the layers 104 and 105 may be made from different materials and/or in different apparatuses. Further, while control of the nitrogen content may make the layers 104 and 105 clearly distinct, these layers may also have more of a gradient of nitrogen therethrough, such that the layers are non-distinct.

Programming/erasing operations of the non-volatile memory on the glass substrate 100 having the SiON layer 104 and the first insulator 105 thereon, formed as above, may function normally, since a leakage current caused by the surface characteristic of the conventional polysilicon may be reduced or eliminated.

Subsequently, as shown in FIG. 1E, the nitride film 106 may be formed on the first insulator 105 using, e.g., an inductively coupled plasma CVD apparatus. The nitride film 106 may be formed with a thickness of approximately 50 to 100 Å, e.g., a thickness of approximately 80 Å. The nitride film 106 may be formed using an ammonia ($NH_3$) gas or a nitrogen ($N_2$) gas. The nitride film 106 may store information by trapping charges in a trap region inside the nitride film 106, an interfacial trap region between the first insulator 105 and the nitride film 106, or an interfacial trap region between the nitride film 106 and the second insulator 107, to be formed later.

Subsequently, referring to FIG. 1F, the second insulator 107 may be formed on the nitride film 106, e.g., using an inductively coupled plasma CVD apparatus. The second insulator 107 may be formed with a thickness of approximately 100 to 200 Å, e.g., approximately 150 Å. The second insulator 107 may function as a blocking oxide film by blocking charges from moving between the gate electrode 108 and the nitride film 106 having a charge trap region in the non-volatile memory formed on the glass substrate.

Subsequently, the metal electrode 108 may be formed by depositing and patterning a metal on the second insulator 107, followed by carrying out a lithographic and an etching process, as shown in FIG. 1G.

A source 109 and a drain 110 may be formed by carrying out a lithographic and an etching process to expose a portion of the polysilicon layer 103, and injecting impurity ions into the exposed polysilicon layer 103, as shown in FIG. 1H.

Figure 2:
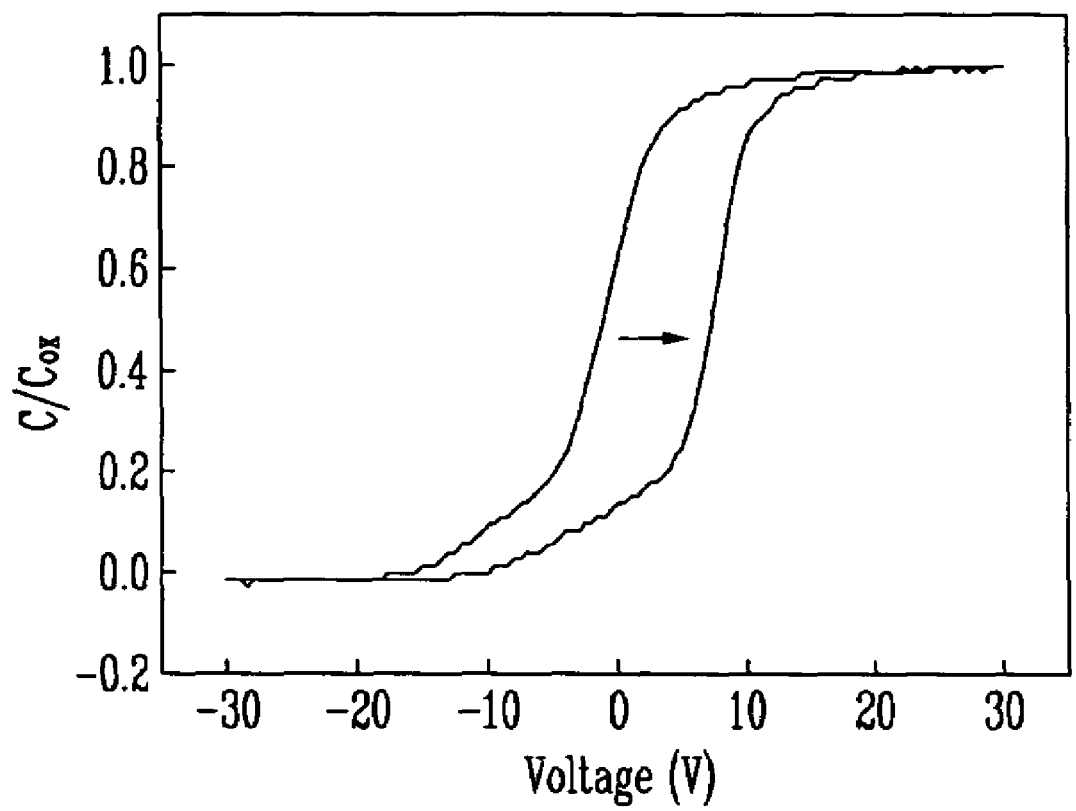
FIG. 2 is a diagram showing a C-V characteristic of a non-volatile memory device according to an exemplary embodiment of the present invention.

FIG. 2 illustrates a diagram showing a C-V characteristic of a non-volatile memory device according to an exemplary embodiment of the present invention.

As can be seen in FIG. 2, the non-volatile memory device in accordance with an exemplary embodiment of the present invention may avoid abnormal programming/erasing characteristics arising from large leakage currents present due to a rough, non-uniform surface of the polysilicon layer formed by the conventional process, i.e., the non-volatile memory device according to an exemplary embodiment of the present invention may have a normal programming/erasing characteristic.

As described above, a non-volatile memory device according to an exemplary embodiment of the present invention may be formed on a glass substrate with an ONO configuration and may normally function, with little or no leakage current. Also, the non-volatile memory device of the present invention may be widely employed in the various fields, since it is compatible with the SOG (System On Glass) technique.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for fabricating a non-volatile memory device, the method comprising:
   forming a buffer oxide film on a substrate;
   forming a polysilicon layer on the buffer oxide film;
   forming a silicon oxy-nitride (SiON) layer on the polysilicon layer;
   forming a first insulator on the SiON layer;
   forming a nitride film on the first insulator;
   forming a second insulator on the nitride film;
   forming an electrode on the second insulator; and
   forming a source/drain by injecting impurity ions into an exposed region of the polysilicon layer,
   wherein forming the polysilicon layer includes irradiating an amorphous silicon layer deposited on the buffer oxide film with a laser beam.

2. The method for fabricating a non-volatile memory device as claimed in claim 1, wherein forming the SiON layer and the first insulator includes using a nitrous oxide plasma.

3. The method for fabricating a non-volatile memory device as claimed in claim 2, wherein forming the SiON layer and the first insulator includes, after a predetermined amount of time, reducing a concentration of nitrogen in the plasma.

4. The method for fabricating a non-volatile memory device as claimed in claim 3, wherein the predetermined amount of time is determined in accordance with a desired thickness of the SiON layer.

5. The method for fabricating a non-volatile memory device as claimed in claim 3, wherein forming the SiON layer and the first insulator includes depositing an insulating material.

6. The method for fabricating a non-volatile memory device as claimed in claim 3, wherein reducing the concentration of nitrogen in the plasma includes substituting oxygen for nitrogen in the plasma.

7. The method for fabricating a non-volatile memory device as claimed in claim 1, wherein the SiON layer is formed with a thickness of approximately 10 to 25 Å.

8. The method for fabricating a non-volatile memory device as claimed in claim 1, wherein the first insulator is formed with a thickness of approximately 20 to 40 Å.

9. The method for fabricating a non-volatile memory device as claimed in claim 1, wherein the first insulator is formed of silicon oxide ($SiO_2$).

10. The method for fabricating a non-volatile memory device as claimed in claim 1, wherein the substrate is glass.

* * * * *